United States Patent
Ahn et al.

(10) Patent No.: US 12,399,201 B2
(45) Date of Patent: Aug. 26, 2025

(54) MODULAR SENSOR PLATFORM APPARATUS

(71) Applicant: SEOUL NATIONAL UNIVERSITY R&DB FOUNDATION, Seoul (KR)

(72) Inventors: Sung-Hoon Ahn, Seongnam-si (KR); Seung-Gi Kim, Gwangmyeong-si (KR); Guyeop Jung, Suwon-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 216 days.

(21) Appl. No.: 18/255,826

(22) PCT Filed: Oct. 14, 2021

(86) PCT No.: PCT/KR2021/014256
§ 371 (c)(1),
(2) Date: Jun. 30, 2023

(87) PCT Pub. No.: WO2022/119111
PCT Pub. Date: Jun. 9, 2022

(65) Prior Publication Data
US 2024/0103055 A1 Mar. 28, 2024

(30) Foreign Application Priority Data
Dec. 2, 2020 (KR) ........................ 10-2020-0166975

(51) Int. Cl.
*G01R 22/10* (2006.01)
*G16Y 10/35* (2020.01)
*G16Y 20/30* (2020.01)

(52) U.S. Cl.
CPC .............. *G01R 22/10* (2013.01); *G16Y 10/35* (2020.01); *G16Y 20/30* (2020.01)

(58) Field of Classification Search
CPC .... G01R 22/10; G01R 21/133; G01R 22/061; G01R 19/2513; G16Y 10/35; G16Y 20/30
(Continued)

(56) References Cited

U.S. PATENT DOCUMENTS 6,112,158 A * 8/2000 Bond ..................... G06Q 50/06
340/657
6,675,071 B1 * 1/2004 Griffin, Jr. ........... G01R 21/133
340/661
(Continued)

FOREIGN PATENT DOCUMENTS

JP 2009-25911 A 2/2009
JP 2013234990 A 2/2017
(Continued)

OTHER PUBLICATIONS

Extended European Search Report for EP21900799 mailed Sep. 13, 2024, 8 pages.
(Continued)

*Primary Examiner* — Christopher P McAndrew
(74) *Attorney, Agent, or Firm* — Kilpatrick Townsend & Stockton LLP

(57) ABSTRACT

Provided is a modular sensor platform apparatus. The modular sensor platform apparatus includes at least one first terminal capable of being coupled to a power sensor, a plurality of second terminals capable of being coupled to an external sensor module and a communication module, and a micro-control unit (MCU) configured to execute a predefined algorithm.

6 Claims, 2 Drawing Sheets

(58) Field of Classification Search
USPC .......................................................... 324/107
See application file for complete search history.

(56) References Cited

U.S. PATENT DOCUMENTS

| | | | | |
|---|---|---|---|---|
| 7,528,612 | B2* | 5/2009 | Gollhardt | H02B 13/025 |
| | | | | 324/501 |
| 7,561,412 | B2* | 7/2009 | Brandt | H02B 13/065 |
| | | | | 361/616 |
| 10,816,579 | B2 | 10/2020 | Arashima et al. | |
| 2004/0150384 | A1* | 8/2004 | Holle | G01R 22/066 |
| | | | | 340/637 |
| 2005/0075808 | A1 | 4/2005 | Jensen et al. | |
| 2008/0081516 | A1* | 4/2008 | Brandt | H02B 13/025 |
| | | | | 439/638 |
| 2008/0154523 | A1 | 6/2008 | Gilbert et al. | |
| 2008/0224690 | A1 | 9/2008 | Nicholson et al. | |
| 2013/0054165 | A1 | 2/2013 | Ramirez | |
| 2013/0123997 | A1* | 5/2013 | King | H02H 3/46 |
| | | | | 700/292 |
| 2014/0097691 | A1 | 4/2014 | Jackson et al. | |
| 2014/0188411 | A1* | 7/2014 | Kim | G01D 4/002 |
| | | | | 702/62 |
| 2014/0300344 | A1* | 10/2014 | Turner | G01R 21/133 |
| | | | | 324/107 |
| 2015/0355245 | A1* | 12/2015 | Ordanis | G01R 31/42 |
| | | | | 702/62 |
| 2016/0190912 | A1* | 6/2016 | Lim | H02M 1/4225 |
| | | | | 363/84 |
| 2016/0349310 | A1* | 12/2016 | Hayashi | G01R 31/42 |
| 2019/0383865 | A1* | 12/2019 | Sim | H04W 72/23 |
| 2022/0076852 | A1* | 3/2022 | Przybylski | G06F 30/18 |

FOREIGN PATENT DOCUMENTS

| | | |
|---|---|---|
| JP | 2017-49259 A | 3/2017 |
| JP | 2019-62375 A | 4/2019 |
| KR | 10-2017-0012857 A | 2/2017 |
| KR | 10-1791030 A | 11/2017 |
| KR | 10-2018-0058113 A | 5/2018 |
| KR | 2018-0058113 A | 5/2018 |
| KR | 200200003670 A | 1/2020 |
| WO | 2022-119111 A1 | 6/2022 |

OTHER PUBLICATIONS

Notice of Reasons for Refusal for JP Appln No. 2023-534008 drafted Aug. 6, 2024, 6 pages.
Request for the Submission of an Opinion for Korean Appln No. 10-2020-0166975 dated Nov. 29, 2022, all pages.
International Search Report and Written Opinion mailed Jan. 20, 2022 in International Patent Application No. PCT/KR2021/014256, 12 pages.

* cited by examiner

MODULAR SENSOR PLATFORM APPARATUS

TECHNICAL FIELD

An embodiment of the present disclosure relates to a modular sensor platform apparatus, and more particularly, to an Internet of Things (IoT)-based modular sensor platform apparatus for use in a smart engineering solution.

BACKGROUND ART

A conventional machine tool power measurement device includes a simple circuit that collects power data and transmits the same through a wire. In addition, conventional devices have insufficient data per unit time to analyze the quality and conditions of machine tools. Conventional devices are intended to measure power rather than to analyze various characteristics of machine tools. Such conventional devices do not conform to the direction of development of smart engineering devices capable of measuring various physical quantities at the same time and calculating various physical quantities of machine tools at a time.

Moreover, when a conventional power measurement apparatus and various sensor systems are attached to one machine tool for measurement, a problem of data synchronization occurs and a measurement value of each sensor needs to be transmitted wirelessly, which increases a traffic volume. In addition, as computation becomes impossible at an end of a system, the efficiency of edge computing as one of the core techniques of smart engineering may not be achieved.

DISCLOSURE

Technical Problem

An embodiment of the present disclosure provides a modular sensor platform apparatus easily applicable to a smart engineering solution by simultaneously serving as an IoT device and for edge computing.

Technical Solution

According to an embodiment of the present disclosure, a modular sensor platform apparatus includes at least one first terminal capable of being coupled to a power sensor, a plurality of second terminals capable of being coupled to an external sensor module and a communication module, and a micro-control unit (MCU) configured to execute a predefined algorithm.

Advantageous Effects

According to an embodiment of the present disclosure, a modular sensor platform apparatus may use a non-contact current measurement scheme and may be implemented with a small size, thus being available by being attached to an existing machine tool. Moreover, various sensor modules and communication modules may be attached, such that various types of data such as temperature, humidity, and vibration as well as 3-phase power may be synchronized and collected and a desired communication protocol (e.g., WiFi5, BLE3, ZigBee, etc.) may be selected for communication. In addition, light-weight artificial intelligence may be inserted for calculation at an edge and thus may be installed in small and medium manufacturing lines where a communication network is not properly established or a sufficient communication speed is not secured, thereby realizing intelligence of the manufacturing line without a burden of the amount of traffic. Furthermore, the modular sensor platform apparatus may be installed on a power distribution board in general home or inside a building, and a temperature sensor, a humidity sensor, an illuminance sensor, etc., may be attached thereto for establishment of intelligence, thus being applicable to a solution of a smart home or a smart building.

MODE FOR INVENTION

Hereinafter, a modular sensor platform apparatus according to an embodiment of the present disclosure will be described in detail with reference to the accompanying drawings.

Figure 1:
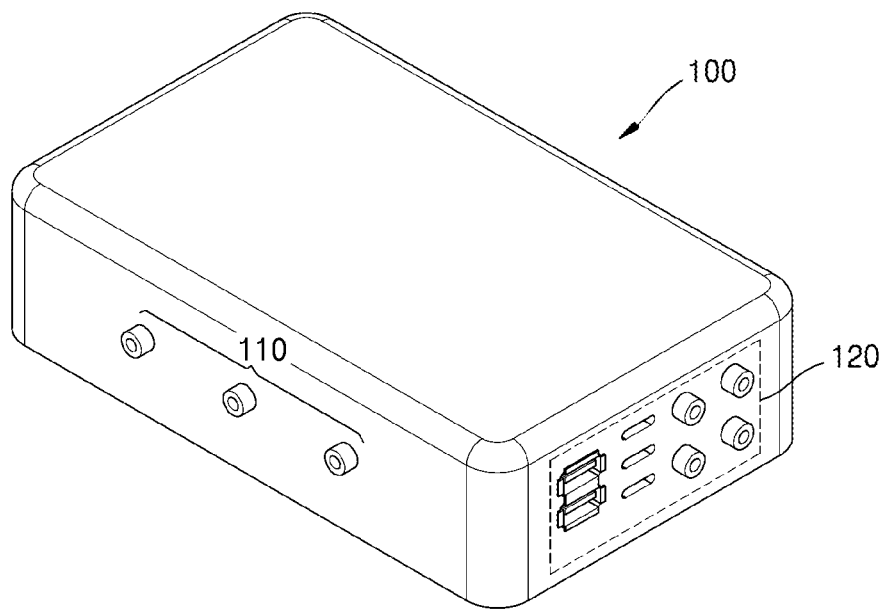
FIG. 1 shows an example of an overall shape of a modular sensor platform apparatus according to an embodiment of the present disclosure.

FIG. 1 shows an example of an overall shape of a modular sensor platform apparatus according to an embodiment of the present disclosure.

Referring to FIG. 1, a modular sensor platform apparatus 100 may include at least one first terminal 110 that may be coupled to a power sensor and at least one second terminal 120 that may be coupled to an external sensor module and a communication module. The modular sensor platform apparatus 100 may include a micro-control unit that executes an algorithm predefined in a main body.

As the modular sensor platform apparatus 100 includes the first and second terminals 110 and 120 that are connectable to various sensor modules and communication modules rather than including the sensor modules and the communication modules therein, the modular sensor platform apparatus 100 may be manufactured to have a small size and a light weight. Moreover, various types of sensor modules and various types of communication modules are connectable to the modular sensor platform apparatus 100, thus being flexibly applicable to various environments. That is, each time when a physical quantity to be measured changes, the sensor module or communication module connected to the modular sensor platform apparatus 100 needs to be changed without replacing the modular sensor platform apparatus 100 or replacing or reassembling internal components thereof, thereby easily implementing the intelligence of conventional factories.

The first terminal 110 may be connected to a non-contact current sensor that measures 3-phase power. Moreover, according to an embodiment, the first terminal 110 may be connected to various types of existing power sensors that measure power.

The second terminal 120 may include a universal serial bus (USB) type and/or a 3-pole terminal. For example, the second terminal 120 may include at least one USB A type, at least one USB C type, and at least one 3.5 mm 3-pole terminal. For example, the communication module may be connected to a USB port, and a sensor that measures temperature, humidity, illuminance, vibration, etc., may be connected to a 3-pole terminal. The 3-pole terminal may receive an output signal from a connected resistance-based sensor and thus serve for data acquisition (DAQ) by reading the output signal without an additional micro-controller.

According to another embodiment, the modular sensor platform apparatus 100 may include at least one image sensor, i.e., a camera, or may be connected to at least one camera through the second terminal 120. In another example, the modular sensor platform apparatus 100 may be wirelessly connected to at least one camera through a communication module connected to the second terminal 120.

The modular sensor platform apparatus 100 may synchronize and collect sensing values of a plurality of sensor modules through the second terminal 120. For example, the modular sensor platform apparatus 100 may collect the sensing values from the plurality of sensor modules at the same time.

Figure 2:
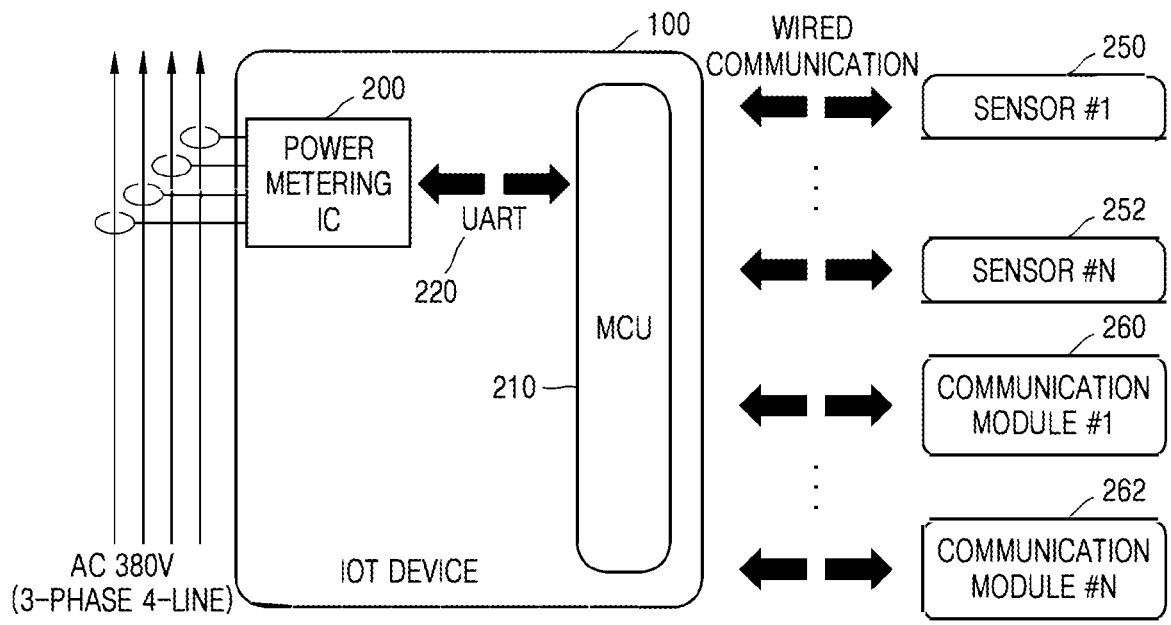
FIG. 2 shows an example of a configuration of a modular sensor platform apparatus according to an embodiment of the present disclosure.

FIG. 2 shows an example of a configuration of a modular sensor platform apparatus according to an embodiment of the present disclosure.

Referring to FIGS. 1 and 2 together, the modular sensor platform apparatus 100 may include a power metering integrated circuit (IC) 200, a micro-control unit (MCU) 210, and a universal asynchronous receiver/transmitter (UART) 220.

The power metering IC 200 may identify power by using a sensing value received from a power sensor through the first terminal 110. For example, the power sensor, which is a current sensor of a non-contact type, may measure current flowing through each wire by being clamped to a 380 V 3-phase 4-wire power supply line. The power metering IC 200 may identify power, etc., based on a current sensing value of each wire, measured by the current sensor.

The MCU 210 may be connected to at least one sensor modules 250 and 252 and at least one communication modules 260 and 262 through the second terminal 120. In an embodiment, the MCU 210 may transmit sensing values received from the at least one sensor modules 250 and 252 connected in a wired communication manner through the communication modules 260 and 262 in a wireless communication manner, but in this case, the amount of traffic may increase. Thus, in the current embodiment, the MCU 210 may transmit a result of performing a calculation process based on the sensing values received from the at least one sensor modules 250 and 252 through the communication modules 260 and 262. An example of calculation performed by the MCU 210 will be described again with reference to FIG. 3.

The MCU 210 may continuously receive a sensing value from a sensor module or determine to operate a sensor module. In an example, the MCU 210 may receive a control command from an external source through the communication modules 260 and 262 to determine the type and number of sensor modules to operate. That is, a user may transmit a control command for operating or stopping operating sensor modules connected to the modular sensor platform apparatus 100 through a server, a user terminal, etc. For example, when first through Nth sensor modules are connected through the second terminal 120, the MCU 210 may operate first and fifth sensor modules upon receiving an operation command for the first and fifth sensor modules.

In another example, the MCU 210 may determine whether to operate a sensor module according to a predefined condition. For example, when any one of the sensor modules is an image sensor, i.e., a camera, a lot of loads may be applied to a storage space or calculation in order for the modular sensor platform apparatus 100 to continuously process an image captured by the camera. In this case, the MCU 120 may normally stop operating the camera, and when a power sensing value connected to the first terminal 110 is abnormal or a value measured from various sensor modules connected to the second terminal 120 corresponds to a predefined condition (e.g., an abnormal state, etc.) then the MCU 120 may operate a camera sensor module. That is, when an abnormal state is discovered in equipment or a space where the modular sensor platform apparatus 100 is installed, the image captured through the camera in this case may be transmitted to the server, the user terminal, etc.

The communication modules 250 and 252 connected to or used for the modular sensor platform apparatus 100 may differ with a communication scheme of a place where the modular sensor platform apparatus 100 is located. For example, when ZigBee communication is required, a ZigBee communication module may be connected to the modular sensor platform apparatus 100.

In another embodiment, a plurality of communication modules 260 and 262 may be previously connected to the modular sensor platform apparatus 100 and when necessary, the MCU 210 may transmit and receive data through any one of the plurality of communication modules 260 and 262. For example, for an environment where a plurality of communication protocols are available, the modular sensor platform apparatus 100 may select any one of the communication protocols according to user settings or a communication environment (e.g., a bandwidth, a communication delay, the amount of traffic, etc.), and transmit and receive data through a communication module supporting the selected communication protocol.

The power metering IC 200 and the MCU 210 may be connected through the UART 220. As the power metering IC 200 and the MCU 210 are physically separated from each other and transmit and receive data through the UART 220, the MCU 210 may be protected in spite of sudden occurrence of an overload, etc., in the power metering IC 200.

Figure 3:
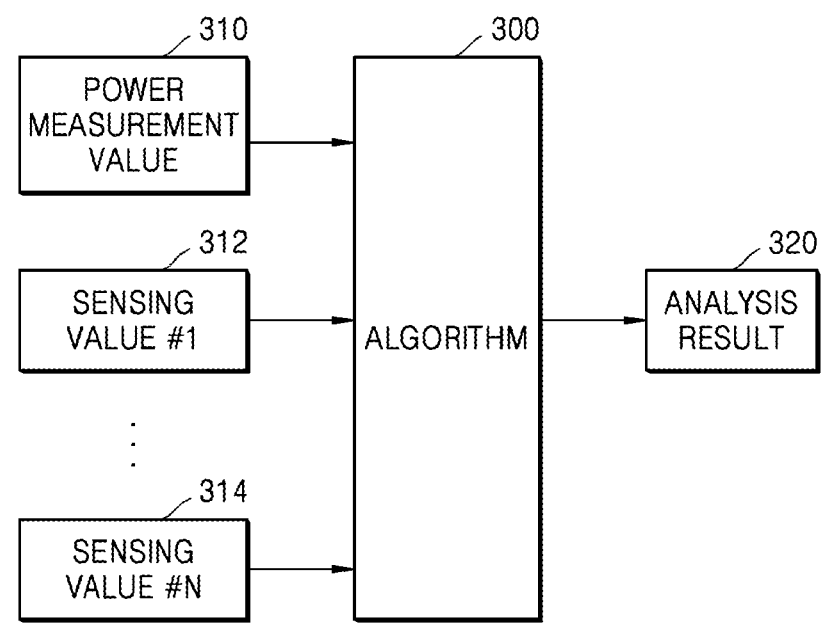
FIG. 3 shows an example of a calculation method used by a micro-control unit according to an embodiment of the present disclosure.

FIG. 3 shows an example of a calculation method used by a micro-control unit according to an embodiment of the present disclosure.

Referring to FIG. 3, the MCU 210 may include an algorithm 300 that may be calculated based on a sensing value, thus serving for a sort of edge computing. The algorithm 300 may be stored in an internal memory of the MCU 210 or a separate memory present in the modular sensor platform apparatus 100.

The MCU 210 may derive an analysis result 320 by inputting a power measurement value 310 identified through a power sensor and sensing values 312 and 314 measured through respective sensor modules, etc., to the algorithm 300. The algorithm 300 may be implemented as a general function, etc., or an artificial intelligence algorithm based on deep learning or machine learning. For example, after attached to a machine tool, etc., the modular sensor platform apparatus 100 may identify whether the machine tool is abnormal by using the power measurement value 310 and the sensing values 312 and 314, and transmit the analysis result 320, thereby reducing the amount of traffic and a calculation load of a central server when compared to transmitting the sensing values 312 and 314.

In another embodiment, operating conditions of various sensor modules may be predefined in the algorithm 300. For example, the MCU 210 may normally operate some of the plurality of sensor modules according to the algorithm 300 to identify whether the machine tool, etc., is abnormal, and may operate the camera upon detection of abnormality through the algorithm 300 to transmit the captured image to the server, the user terminal, etc.

According to another embodiment, the MCU 210 may receive a control command of whether to operate a specific sensor module from the user through a communication module. For example, the MCU 210 may receive the control command of whether to operate the camera from an external source, operate the camera according to the control command, and transmit the captured image.

So far, embodiments have been described for the disclosure. It would be understood by those of ordinary skill in the art that the disclosure may be implemented in a modified form within a scope without departing from the essential characteristics of the disclosure. Therefore, the disclosed embodiments should be considered in a descriptive sense rather than a restrictive sense. The scope of the present specification is not described above, but in the claims, and all the differences in a range equivalent thereto should be interpreted as being included in the disclosure.

The invention claimed is:

1. A modular sensor platform apparatus comprising:
at least one first terminal capable of being coupled to a power sensor;
a plurality of second terminals capable of being coupled to an external sensor module and a communication module; and
a micro-control unit (MCU) configured to execute a predefined algorithm,
wherein the MCU is further configured to operate a camera connected to one of the plurality of second terminals and to transmit an image captured through the camera when a power sensing value of the power sensor received through the first terminal is abnormal.

2. The modular sensor platform apparatus of claim 1, wherein the first terminal is connected to a non-contact current sensor configured to measure 3-phase power.

3. The modular sensor platform apparatus of claim 1, wherein the second terminal comprises a universal serial bus (USB) type terminal.

4. The modular sensor platform apparatus of claim 1, wherein the second terminal comprises a 3-pole terminal, and the 3-pole terminal is configured to receive an output signal from a connected resistance-based sensor module.

5. The modular sensor platform apparatus of claim 1, wherein the algorithm is an artificial intelligence algorithm based on deep learning, and the MCU is configured to transmit, through a communication module, a result obtained by inputting sensor values received through the first terminal and the second terminal to the algorithm.

6. The modular sensor platform apparatus of claim 1, further comprising a power metering integrated circuit (IC) configured to meter power based on a signal received through the first terminal,
wherein the power metering IC and the MCU are connected to each other through a universal asynchronous receiver/transmitter (UART).

* * * * *